United States Patent [19]

Benzing

[11] Patent Number: 4,786,352
[45] Date of Patent: Nov. 22, 1988

[54] APPARATUS FOR IN-SITU CHAMBER CLEANING

[75] Inventor: David W. Benzing, San Jose, Calif.
[73] Assignee: Benzing Technologies, Inc., San Jose, Calif.
[21] Appl. No.: 907,044
[22] Filed: Sep. 12, 1986
[51] Int. Cl.[4] .............................................. C23F 1/02
[52] U.S. Cl. .................................... 156/345; 156/643; 156/646; 204/298; 204/132; 134/1
[58] Field of Search ................ 156/345, 643, 646; 204/298, 192, 132; 134/1; 219/543

[56] References Cited

U.S. PATENT DOCUMENTS

| 4,123,316 | 10/1978 | Tsuchimoto | 156/643 |
| 4,123,663 | 10/1978 | Horiike | 250/531 |
| 4,138,306 | 2/1979 | Niwa | 156/345 |
| 4,304,983 | 12/1981 | Pierfederici | 156/646 |
| 4,362,632 | 12/1982 | Jacob | 156/345 |
| 4,368,092 | 1/1983 | Steinberg et al. | 156/345 |
| 4,388,522 | 6/1983 | Boaz | 219/543 |
| 4,483,737 | 11/1984 | Mantei | 156/345 |
| 4,529,474 | 7/1985 | Fujiyama et al. | 156/345 |
| 4,576,698 | 3/1986 | Gallagher et al. | 156/643 |
| 4,657,616 | 4/1987 | Benzing et al. | 156/646 |
| 4,668,270 | 5/1987 | Ramus | 219/543 |

FOREIGN PATENT DOCUMENTS

| 56-26539 | 3/1981 | Japan . |
| 56-258143 | 12/1981 | Japan . |
| 56-166935 | 12/1981 | Japan . |
| 57-13737 | 1/1982 | Japan . |
| 57-27024 | 2/1982 | Japan . |
| 57-69744 | 4/1982 | Japan . |
| 58-21826 | 2/1983 | Japan . |
| 58-171563 | 8/1983 | Japan . |
| 2062689 | 5/1981 | United Kingdom . |

Primary Examiner—David L. Lacey
Assistant Examiner—Lori-Ann Johnson
Attorney, Agent, or Firm—Robert O. Guillot

[57] ABSTRACT

An apparatus for the in-situ cleaning of the interior surfaces of a processing chamber (14) and/or tooling or substrates disposed within said chamber where said chamber is composed substantially of dielectric material having at least one powered and one grounded electrode (30) formed from a thin film of conductive material deposited directly on the exterior surface of said chamber, a means for introducing gas (26) into the chamber, a means for establishing and maintaining a reduced pressure environment (22) within the chamber, and a supply of radio frequency power (32). A plasma is created in the chamber by the interaction of the RF field established in the chamber upon the application of RF power to the electrodes with the gas in the chamber, and the plasma creates gaseous species that etch unwanted deposits and/or contaminates from the interior surfaces of the chamber and/or the surfaces of tooling or substrates disposed in the chamber. Several different configurations and structures of the electrodes are shown as well as applications to chambers of several different types of processing equipment.

33 Claims, 12 Drawing Sheets

APPARATUS FOR IN-SITU CHAMBER CLEANING

BACKGROUND OF THE INVENTION

1. Field of the Invention

The present invention relates generally to cleaning devices utilized to remove deposits and/or contamination from processing chamber walls, tooling and substrates within such chambers and, more particularly, to such devices which utilize a plasma formed within the processing chamber to achieve such cleaning.

2. Discussion of the Prior Art

In the course of many semiconductor device processing steps, unwanted deposits and/or contaminants are formed on the chamber walls of the processing equipment. As these deposits and/or contaminants accumulate in successive runs, they can dislodge from the chamber wall, yielding particulate and/or chemical contamination of the wafers and low die yield. Frequent cleaning of the chamber wall is thus required.

In the past, chamber cleaning usually meant disassembly of the chamber from the equipment and cleaning with corrosive and toxic chemicals. The drawbacks of this method are obvious: long equipment downtimes, high labor costs and loss of process repeatability due to chamber disassembly/reassembly, breakage and/or degradation of the chamber and other equipment parts due to diassembly/reassembly and handling, the chemical contamination of the chamber by liquids used to clean it and handling, and safety hazards associated with the use of corrosive and toxic chemicals.

A more recent innovation in the method of cleaning process chambers is that described in commonly assigned U.S. patent application Ser. No. 06/735,821, filed May 17, 1985 now U.S. Pat. No. 4,657,616 for In-situ CVD Chamber Cleaner by David Benzing and others. It describes the use of two or more electrodes placed in the interior of a process chamber or a single internal electrode together with the use of furnace coils or radiant lamp assemblies as an external electrode to create a plasma within the process chamber that effectively cleans the chamber walls. A disadvantage of this apparatus and method is that the electrode structure is fairly large and must be inserted and then removed from the chamber, requiring sufficient access space to the chamber. A further disadvantage is the inability to simultaneously clean the chamber together with any associated tooling.

SUMMARY OF THE INVENTION

It is an object of the present invention to provide an improved device and method for cleaning process chambers in-situ.

It is another object of the present invention to provide a device and method that is suitable for in-situ cleaning of process chambers of almost any size and shape that are made of dielectric material.

It is a further object of the present invention to provide a device and method that is suitable for in-situ cleaning of substrates placed within process chambers prior to processing.

It is yet another object of the present invention to provide a device and method that is suitable for in-situ cleaning of tooling placed within process chambers.

The device and method of the present invention consists of two or more electrodes that may be shaped as interleaving fingers and that are fixtured on the exterior of a process chamber that is constructed primarily of dielectric material. RF power and ground potential are coupled to the electrodes. By evacuating the chamber, admitting a cleaning gas and applying RF potential, a plasma is formed within the chamber. By appropriate choice of the cleaning gas and the configuration of the electrodes, either the interior walls of the chamber together with any tooling can be cleaned or the surfaces of substrates placed within the chamber can be cleaned.

The device and method is most effective in removing deposits of $SiO_2$, $Si_3N_4$, organic compounds and other dielectric compounds, as well as almost all types of contaminants. Light deposits of silicon, other semiconductors and some conductive materials can also be effectively removed.

In the preferred embodiment, the electrodes comprise conductive or semiconductive films that are deposited on the exterior of the dielectric chamber wall. The number, size and shape of the electrodes are designed specifically for each chamber size and shape to yield a relatively uniform plasma over the whole of the interior chamber wall. Several different types of electrode materials are suggested, depending upon the application and the user's needs.

It is an advantage of the present invention that the use of deposited electrodes in specially designed shapes results in the creation of a relatively uniform plasma throughout the interior of the chamber volume and minimal effect on the processing equipment's existing operating specifications, including heat loss.

It is another advantage of the present invention that the ease with which the cleaning cycle can be performed as well as its short cycle time means that cleaning can be done frequently, even after every processing cycle.

It is a further advantage of the present invention that substrates can be cleaned in-situ of organic contaminants and native oxides as well as other surface contaminants prior to processing.

It is yet another advantage of the present invention that substrates can be subjected to cleaning in-situ alternately with a processing step or steps.

It is yet a further advantage of the present invention that the increased area of electrodes results in lower plasma voltages.

It is still another advantage of the present invention that it is possible to clean any tooling within the chamber at the same time that the walls are cleaned.

These and other objects and advantages of the present invention will no doubt become apparent to those of ordinary skill in the art after having read the following detailed description of the preferred embodiments which are illustrated in the several figures of the drawing.

IN THE DRAWINGS

DESCRIPTION OF THE PREFERRED EMBODIMENT

The device of the present invention utilizes thin conductive or semiconductive films that are deposited on the exterior of a process chamber fabricated from dielectric material such as quartz ($SiO_2$), alumina ($Al_2O_3$), mullite ($Al_2O_3$-$SiO_2$) or glass. The thin films are preferrably patterned to create an interleaved structure of electrodes. A source of RF power and ground potential are coupled to the electrodes. By evacuating the process chamber, admitting a cleaning gas and applying RF potential to the electrodes, a plasma is formed within the chamber that is relatively uniform over the entire internal surface of the chamber. By appropriate choice of cleaning gas, either the interior walls of the chamber and associated chamber tooling, or the surfaces of substrates placed within the chamber can be cleaned of deposits and/or contaminants.

Figure 1:
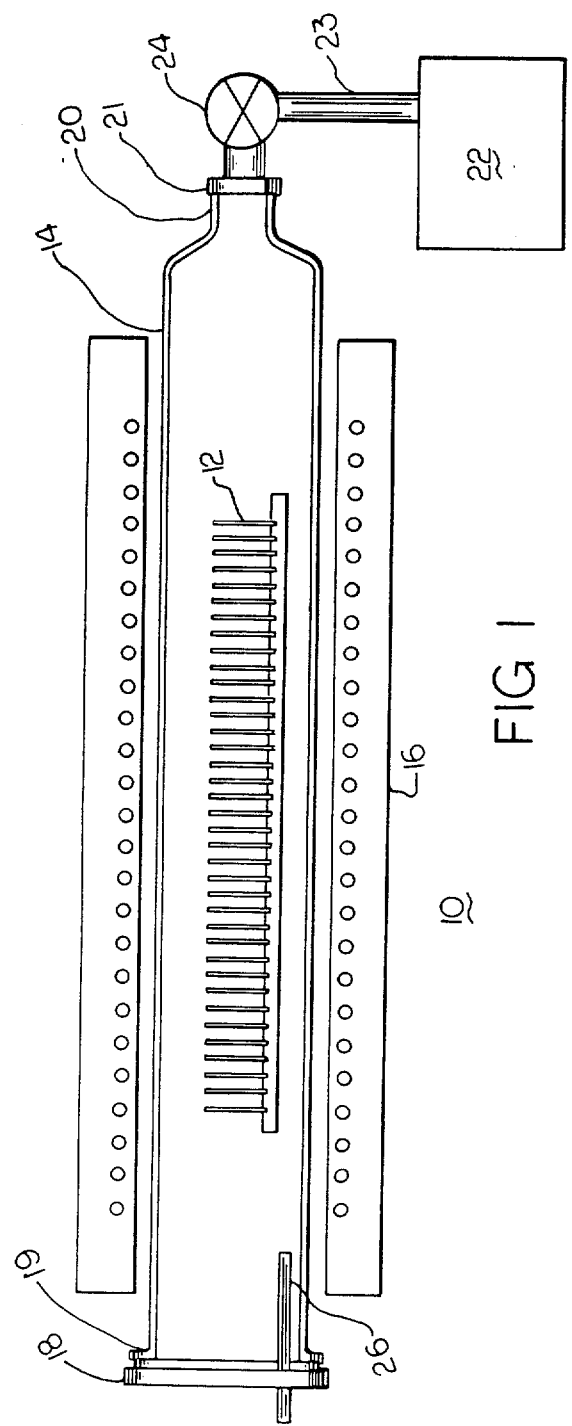
FIG. 1 is a side elevational view of a generalized low pressure chemical vapor deposition system.

One particularly suitable application of the device and method is Low Pressure Chemical Vapor Deposition (LPCVD) systems. FIG. 1 depicts a generalized LPCVD system 10 wherein substrates 12 are processed within a tubular quartz chamber 14 located within furnace 16. One end 19 of the quartz chamber 14 is sealed with a baseplate 18 while the other end 20 is connected to a vacuum pump 22 via a ball joint 21 and vacuum exhaust line 23 configured with a vacuum valve 24 to facilitate evacuation of the chamber 14. Processing gas is introduced through a suitable inlet 26 formed through the baseplate 18.

Figure 2:
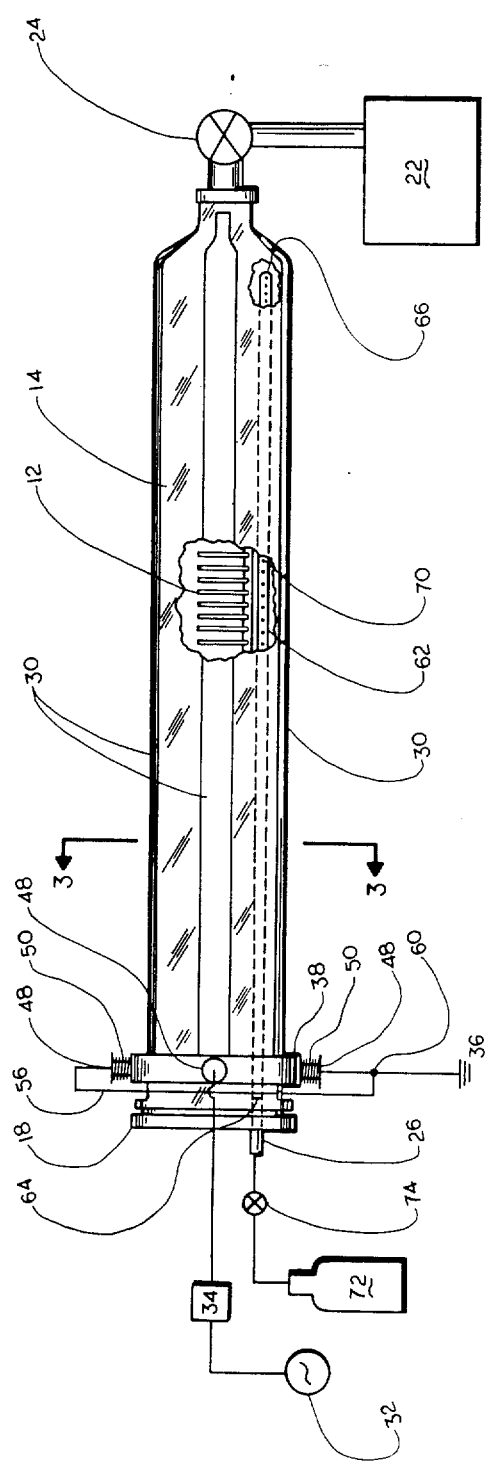
FIG. 2 is a side elevational view of a first embodiment of the present invention.
Figure 3:
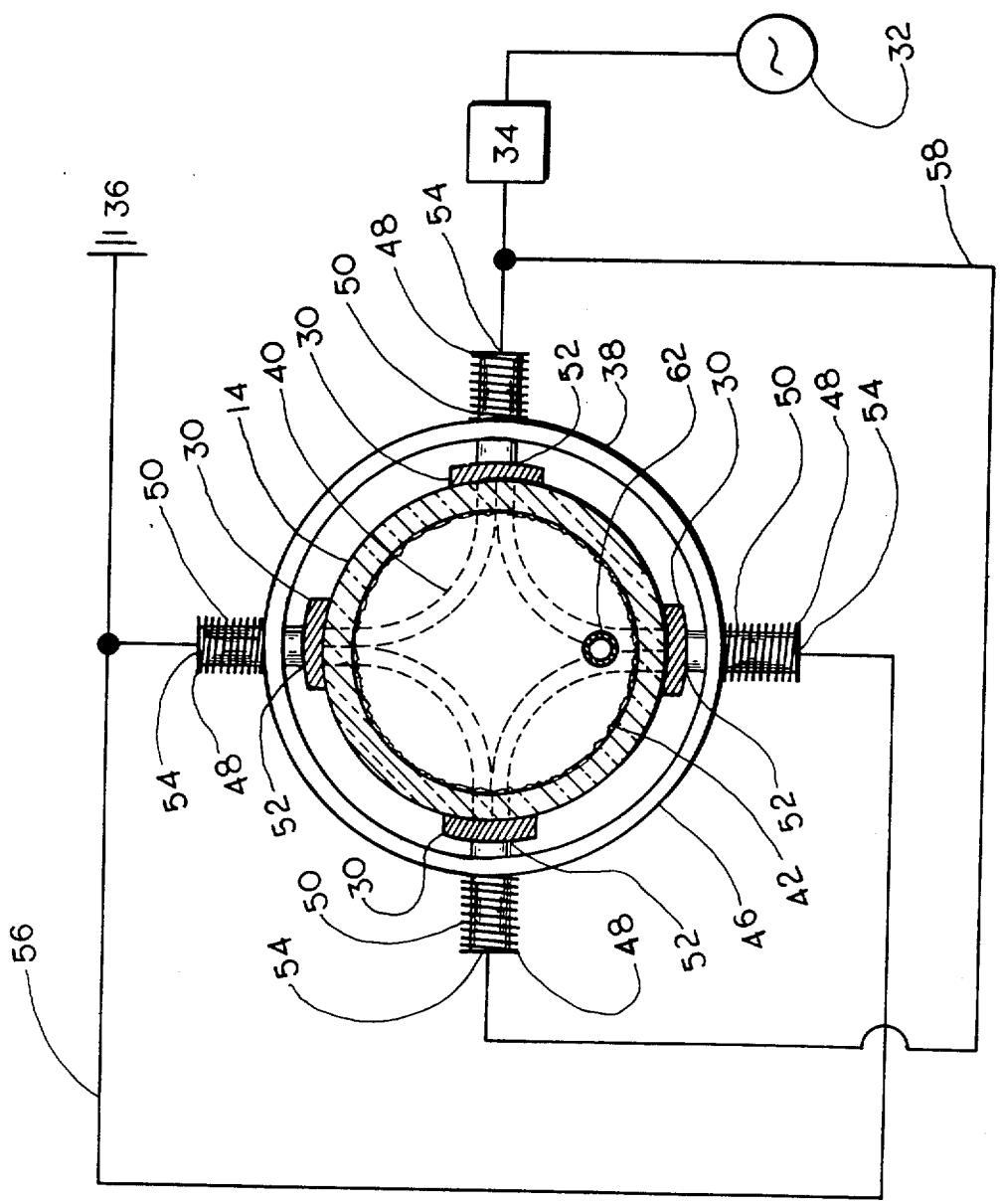
FIG. 3 is a cross-sectional view taken along lines 3—3 of FIG. 2.

FIGS. 2 and 3 depict the basic device of the present invention for the in-situ cleaning of the LPCVD chamber and/or substrates within the chamber. Four electrodes 30 are deposited on the outside of the quartz chamber 14. The electrodes 30 are alternately connected to a source of RF power 32 through a matching network 34 and to ground potential 36, by means of a connection ring 38 resulting in the formation of an electric field 40 within the evacuated chamber near the chamber wall. The electric field 40 causes the cleaning gas within the chamber 14 to breakdown and a plasma to be created for the cleaning of a deposit 42 from the wall of the chamber 14 or for the cleaning of substrates 12 placed within the chamber 14.

The connection ring 38, as depicted in FIGS. 2 and 3, consists of a support ring 46 fabricated of dielectric material such as $Al_2O_3$, through which protrudes connection rods 48, one for each electrode 30. The connection rods 48 are fabricated of conductive material such as copper and are pressed inward against the electrodes 30 by means of springs 50. The ends 52 of the connecting rods 48 that contact the electrodes 30 are coated with a high conductivity material such as gold to ensure good electrical contact. The opposite ends 54 are connected alternately to one of two wires 56 or 58 that encircle the support ring 46.

Cleaning gas is introduced into the chamber 14 via a single gas distribution tube 62 which is typically located axially along the lower portion of the LPCVD tube 14. The inlet end 64 of the gas distribution tube 62 is fixtured coaxially over the gas inlet tube 26 located on the baseplate 18. The opposite end 66 of the gas distribution tube 62 is closed. Small holes 70 are fabricated in the wall of the gas distribution tube 62. The holes 70 are distributed along the axially length of the gas distribution tube 62 in the upper quadrant, resulting in a relatively uniform distribution of the cleaning gas throughout the chamber 14.

To utilize the instant device as generally depicted in FIGS. 2 and 3 for chamber cleaning, substrates 12 are removed from the quartz tube 14 and the baseplate 18 is affixed to the front of the tube 14, making a vacuum tight seal. The tube 14 is evacuated via the vacuum pump 22 by opening valve 24, and cleaning gas is introduced into the tube 14 through inlet 26 to which gas distribution tube 62 is affixed. The cleaning gas is supplied from a gas cylinder 72 and its flow is controlled by a flow control device 74. The gas may be such known gases as $CF_4$, $CF_4+O_2$, $C_2F_6$, $SF_6$ or $NF_3$. RF power of 100 to 5000 watts at 50 KHz to 100 MHz is applied from the RF power source 32 through the matching network 34 to every other electrode 30 with the remaining electrodes 30 being connected to ground potential 36, creating a plasma within the tube 14. Etchant species created by the decomposition of the cleaning gas in the plasma react with wall deposits and/or contamination 42 to form volatile products which are pumped out of the tube 14 by the vacuum pump 22.

Assuming $NF_3$ is used as the cleaning gas, the following reactions are believed to occur within an $NF_3$ plasma:

  $NF_3 + e^- \rightarrow NF_2 + F^-$ (1)

  $F^- + e^- \rightarrow F + 2e^-$ (2)

  $NF_3 + e^- \rightarrow NF_2 + F + e^-$ (3)

  $NF_2 + e^- \rightarrow NF + F + e^-$ (4)

  $NF + NF \rightarrow N_2 + 2F$ (5)

  $NF_2 + NF \rightarrow N_2 + 3F$ (6)

The atomic fluorine thus generated diffuses or is transported to the wall of the LPCVD tube 14 and ans away the deposited films and/or contaminants 42 ough the reactions:

$$Si(s) + 4F(g) \rightarrow SiF_4(g) \qquad (7)$$

$$SiO_2(s) + 4F(g) \rightarrow SiF_4(g) + O_2(g) \qquad (8)$$

$$Si_3N_4(s) + 12F(g) \rightarrow 3SiF_4(g) + 2N_2(g) \qquad (9)$$

$$C_xH_yO_z(s) + F(g) \rightarrow CF_4(g) + HF(g) + O_2(g) \qquad (10)$$

Utilizing four 125 mm wide copper electrodes approximately 25 microns thick spaced 30 mm apart on the exterior of a 200 mm diameter, 2.1 meter long quartz PCVD tube, the following etch rates of wall deposit material were obtained at the listed process parameters and RF power at 450 KHz:

| Power, KW | Pressure, torr | NF3 Flow, slm | Temp., °C. | SiO2 Etch Rate, u/min | Si Etch Rate, u/min | Uniformity, ±% |
|---|---|---|---|---|---|---|
| 1.5 | 1.3 | 1.0 | 25 | 1.0 | 6.7 | 10 |
| 1.5 | 2.0 | 2.0 | 25 | 1.5 | 4.4 | 15 |

Other cleaning gases that yield atomic fluorine upon decomposition in a plasma such as sulfur hexafluoride and fluorocarbons may also be utilized instead of NF3 as well as mixtures of those gases or NF3 with inert gases such as argon, helium or nitrogen. Additionally, other cleaning gases that yield a specie(s) upon decomposition in a plasma which, upon reaction with the chamber wall deposits and/or contaminants, yields a volatile product may also be used such as CF3Cl, CF3Br, CCl4, BCl3, Cl2, HCl, HBr, O2, or various combinations of the preceeding gases with themselves and/or inert gases such as those listed above.

The above described device and method can be used to clean similar deposits and/or contaminants from tooling used in the process chamber either separately or simultaneously with cleaning of the chamber walls.

To utilize the instant device as generally depicted in FIGS. 2 and 3 for in-situ substrate cleaning prior to processing, substrates 12 are placed within the quartz tube 14 and the baseplate 18 is affixed to the front of the tube 14, making a vacuum tight seal. The tube 14 is evacuated via the vacuum pump 22 by opening valve 24, and a cleaning gas is introduced into the tube 14 through inlet 26 to which a gas distribution tube 62 is affixed. The cleaning gas is supplied from a gas cylinder 72 and its flow is controlled by a flow control device 74. The gas may be such known gases as H2 or Ar+NF3. RF power of 100 to 5000 watts at 50 KHz to 100 MHz is applied from the RF power source 32 through the matching network 34 to every other electrode 30 with the remaining electrodes 30 being connected to ground potential 36, creating a plasma within the tube 14. Etchant species created by the decomposition of the cleaning gas in the plasma react with contaminants on the surfaces of the substrates 12 to form volatile products which are pumped out of the tube 14 by the vacuum pump 22.

Assuming H2 is utilized as the cleaning gas, H2 fragments in a plasma via the following reactions:

$$H_2 + e^- \rightarrow H_2^+ + 2e^- \qquad (11)$$

$$H_2 + e^- \rightarrow 2H + e^- \qquad (12)$$

The atomic hydrogen thus generated diffuses or is transported to the surface of the substrates 12 within the tube 14 and cleans away the native oxide layer and/or contaminants on the substrates 12 as illustrated in the following reactions:

$$SiO_2(s) + 4H(g) \rightarrow SiH_4(g) + O_2(g) \qquad (13)$$

$$C_xH_yO_z(s) + H(g) \rightarrow CH_4(g) + H_2O(g) + H_2(g) \qquad (14)$$

Utilizing four 125 mm wide copper electrodes approximately 25 microns thick spaced 30 mm apart on the exterior of a 200 mm diameter, 2.1 meter long quartz LPCVD tube, with 1.5 KW of RF power at 450 KHz, 2.0 slm of H2, 2.0 torr and a temperature of 25 C., etch rates of positive photoresist and SiO2 on silicon substrates located within the quartz tube were 110 and 40 angstroms/minute, respectively.

Other cleaning gases that yield a specie(s) upon decomposition and/or reaction in a plasma that reacts with contaminants and/or unwanted films on the surface of a substrate to yield a volatile product may also be used such as NF3, HCl, Cl2 or O2, as well as mixtures of those gases with inert gases such as He, Ar or N2.

The above described device and method can also be utilized for multiple cleaning steps performed alternately with processing steps. For example, in the selective deposition of tungsten on silicon wafers patterned with SiO2, tungsten is deposited on areas of exposed silicon and not on areas of exposed SiO2 by careful control of the process gas chemistry. However, the tungsten deposition reaction is catalyzed by tungsten deposits, thus unwanted deposits of tungsten on SiO2 surfaces will enhance the deposition of more tungsten there. By performing multiple short deposition cycles alternately with a cleaning cycle designed to remove the unwanted tungsten deposits, a superior selective deposition of the tungsten can be achieved.

The use of thin conductive films deposited directly on the exterior of the process chamber 14 as electrodes 30 is more advantageous than the use of electrodes that are physically held against the chamber's exterior. The deposited electrodes 30 are exactly conformal to the chamber's shape and, since they utilize the chamber 14 itself for mechanical strength, do not require intricate holding mechanisms. As deposited electrodes 30 are in intimate contact with the chamber wall, the air gap that would be present between separate electrodes and the chamber wall is eliminated, lowering the RF peak to peak voltage required to create the plasma. In many applications the process chamber 14 is situated within a furnace. In those cases, deposited electrodes 30 are superior as their much smaller mass does not effect the thermal operation of the furnace and their much smaller cross section will not cause undue heat loss by conduction along their length. Several types of materials that may be used as the deposited electrodes 30 and their structure are discussed hereinafter.

As shown in FIG. 3, the electric field 40 originates at one electrode 30, penetrates the wall of the dielectric chamber 14, passes through the gaseous ambient within the chamber 14, repenetrates the chamber wall and terminates at the adjacent oppositely powered electrodes 30. If there is a deposit 42 on the interior wall of the chamber 14 as shown in FIG. 3, the electric field may be modified dependent upon the electrical properties of the deposit 42. If the deposit 42 is a dielectric compound, the electric field 40 will be identical to that depicted in FIG. 3. If the deposit 42 is a conductive or semiconductive compound, the electric field 40 will be "shorted" to some degree and some power will be directly transmitted from the RF powered electrodes 30 to the grounded electrodes 30 through deposit 42. The degree to which the electric field 40 is shorted and the power delivered to the gaseous ambient in the chamber diminished is dependent upon the conductivity and the thickness of the deposit 42. For thin deposits 42 with poor conductivity, only minimal power is shorted directly to the ground electrodes through the deposit 42 and sufficient power is delivered to the gaseous ambient to create a plasma and form sufficient etchant species to etch away the deposit 42. As the thickness and/or the conductivity of the deposit 42 is increased, the amount of power directly lost to ground through the deposit 42 increases, decreasing the power delivered to the plasma and decreasing the effectiveness of cleaning. At certain combinations of deposit thickness and conductivity the effectiveness of the cleaning is too low to be practical or a plasma cannot be formed, and an alternative device and method must be employed.

A related configuration to that described in FIGS. 2 and 3 is created by decreasing the number of electrodes 30 to two or increasing the number to six or any even number, where the electrodes 30 are alternately connected to RF power and ground. The pattern of the electrodes can take many forms, several of which are described hereinafter.

Figure 4A:
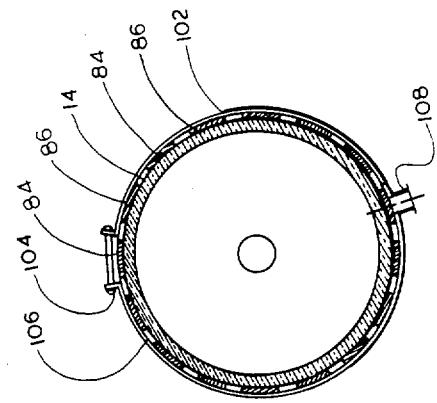
FIG. 4A is a cross-sectional view taken along lines A—A of FIG. 4.
Figure 4:
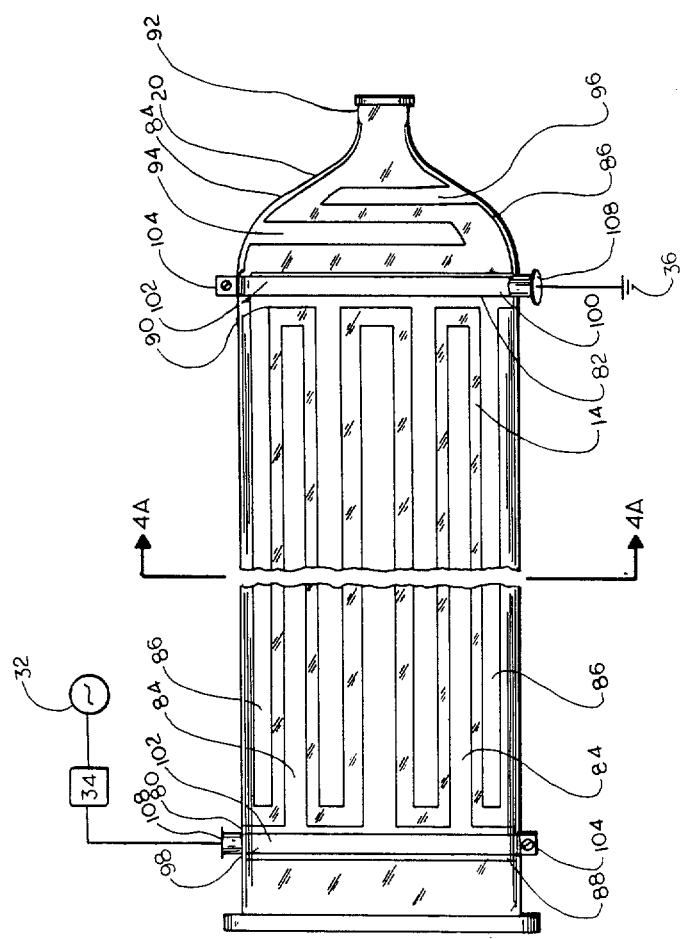
FIG. 4 is a side elevational view of another embodiment of the present invention.

The electrode structure of a preferred embodiment for long cylindrical tubes such as those used in LPCVD is depicted in FIGS. 4 and 4A. The preferred embodiment has two electrodes 80 and 82 that are each configured into a large number of longitudinally-oriented, narrow, interleaved electrode fingers 84 and 86, respectively, separated by a distance nominally one-half that of the electrode finger width, although other variations have been developed for certain applications. In FIGS. 4 and 4A, two deposited electrodes 80 and 82 are patterned so as to yield eight powered electrode fingers 84 interleaved with eight grounded electrode fingers 86 on the exterior of the main body of the quartz tube 14. Each set of electrode fingers 84 and 86 are electrically and physically connected to each other within the set by means of partial electrode rings 88 and 90, respectively, one such ring 88 or 90 being located proximate each tube end, respectively. For the particular type of LPCVD tube shown in FIGS. 4 and 4A, where one end 20 of the tube 14 decreases in diameter to form a nipple 92, one powered electrode finger 84 and one grounded electrode finger 86 are formed so as to extend down the decreasing diameter onto the nipple 92, with circular, interleaved electrode fingers 94 and 96 extending from each of the powered and grounded electrode fingers 84 and 86, respectively. The electrode fingers 94 and 96 should have a width and spacing essentially identical to that used for electrode fingers 84 and 86.

Electrical connection of the electrodes 80 and 82 may be made by use of a single connecting ring 38 as depicted in FIG. 2, or, alternately, as shown in FIGS. 4 and 4A, by means of two connecting rings 98 and 100, situated at opposite ends of the tube 14 directly above the partial electrode rings 88 and 90. Each of the connecting rings 98 and 100 is constructed of a flexible strap 102 fabricated from a conductive material such as copper and affixed to the tube 14 by means of a clamp 104. The inner surface 106 of the strap 102 may be coated with a high conductivity material such as gold in order to ensure a good electrical contact. The length and width of the straps 102 is that of the partial electrode rings 88 and 90 and the straps 102 are affixed to the tube 14 directly over the partial electrode rings 88 and 90 with the clamps 104 positioned over the break in the partial electrode rings 88 and 90 such that the straps do not contact the opposing electrode 82 or 80, respectively. RF and ground potential is connected to each connecting ring 98 and 100, respectively, by a means of a screw clamp 108. The connection of RF power and ground potential at opposite ends of the tube 14, can yield a more uniform plasma by oppositely cancelling any resistive losses in the electrode fingers 84 and 86 that may occur over the length of the tube 14.

The width of the electrode fingers relative to their separation width has been found to have an effect on the plasma and etch rate uniformity, the ease of RF coupling to the plasma and the developed RF peak to peak voltage. At an electrode finger width to separation width ratio of less than one, the high power density (watts per square centimeter of electrode area) results in high RF peak to peak voltages which, together with the increased edge effects caused by the high ratio of electrode edge length to electrode area, can result in nonuniform etching of the chamber wall deposits. For electrode finger width to separation width ratios of greater than ten, the electric field coupling distance between electrode centers as compared to electrode edges becomes so large as to cause a plasma intensity gradient over the electrode width which may also cause nonuniform etching. Based on experimental results with an LPCVD tube, an electrode finger width to separation width of approximately two has been found to yield the best combination of high etch rate uniformity, high absolute etch rate and low RF peak to peak voltages.

The minimum separation width between electrode fingers is set by the lower value of breakdown voltage either in air or long the surface of the chamber and the RF peak to peak voltage developed between the electrodes. For air at 600 degrees Celcius, the breakdown voltage is approximately 3 KV/cm. The breakdown voltage for arcing along the surface of the chamber is dependent upon the chamber material and its cleanliness. For a perfectly clean surface, the surface breakdown voltage is that of the bulk material, which for $SiO_2$ at 600 C. is approximately 20 KV/cm. Surface contamination can drastically lower the breakdown voltage. Assuming negligible surface contamination, the lower of the breakdown voltages between air and the $SiO_2$ surface is that of air. The developed RF peak to peak voltage between the electrodes is dependent upon the geometry of the chamber and electrode structure, the frequency and power of the applied RF, the pressure within the chamber and the type of cleaning gas. For a 200 mm diameter by 2.1 meter long quartz tube patterned with sixteen 25 mm wide, axially-oriented, interleaved electrode fingers at 600 degrees Celcius with an internal pressure of 2 torr of $NF_3$, and 2000 watts RF power at 450 KHz being applied, the developed RF peak to peak voltage is approximately 3 KV, thus setting a lower limit of electrode separation width at approximately 1 cm.

By setting the electrode finger width to twice that of the minimum electrode separation width, the maximum number of electrode fingers in the structure can be determined from the equation:

$$N = \pi D/(3 \cdot W \cdot S) \qquad (15)$$

where N is the maximum number of electrode fingers, D is the outside diameter of the tube, W is the minimum electrode separation width and S is a safety factor for minimum separation, typically 1.3. Further, N must be an even number so that the interleaved structure can consist of alternate RF powered and grounded electrode fingers and that the area of the powered electrode is equal to that of the grounded electrode, which will equalize the plasma-electrode potential difference for both powered and grounded electrodes, making the effects of the plasma over the interior wall uniform. For the 200 mm diameter tube example used above, Equation (15) yields N equal to 16.

While fewer electrodes than the maximum defined above may be employed (by using a wider electrode finger separation width or greater electrode finger width to separation ratio), it is advantageous to use, where possible, the maximum number. This is because the electrode structure possessing the maximum number of electrodes will also possess the maximum electrode area in combination with the maximum ratio of linear electrode edge length to electrode area, resulting in maximum capacitance of the electrode structure, which in turn results in the minimum RF peak to peak voltage. Minimal RF peak to peak voltages are desirable because of their greater ease of handling in cables and connectors, reduced ion bombardment damage to the chamber wall, and reduced radio frequency interference (RFI).

Care must be taken in the design of the electrode structure to minimize the amount of RF coupling to the baseplate 18 at the large diameter end of the tube 14 or the vacuum ball joint 21 at the nipple 92. As both the baseplate 18 and ball joint 21 are typically fabricated from stainless steel, aluminum or some other metallic material and are exposed to the plasma, undesirable and nonuniform coupling of RF power may occur if the electrodes 80 and 82 are located too close to either the baseplate 18 or the ball joint 21. The minimum desirable spacing between the electrodes 80 and 82 and the baseplate 18 or ball joint 21 is dependent upon many factors including RF frequency and power, pressure, gas composition, and tube material and size. For a 200 mm diameter by 2.1 meter long quartz tube with 2 KW RF power at 450 KHz with NF3 gas at 2 torr, the spacings are approximately 15 cm at the baseplate 18 and 5 cm at the nipple 21.

Utilizing the instant invention as described above with sixteen 25 mm wide interleaved, copper electrodes approximately 25 microns thick and spaced 14 mm apart on the exterior of a 200 mm diameter, 2.1 meter long quartz LPCVD tube, the following etch rates of wall deposit material were obtained at the listed process parameters:

| Power, KW | Pressure, torr | NF3 Flow, slm | Temp., °C. | SiO2 Etch Rate, u/min | Si Etch Rate, u/min | Uniformity, ±% |
|---|---|---|---|---|---|---|
| 1.5 | 2.0 | 1.9 | 25 | 0.5 | 3.0 | 6 |
| 1.5 | 1.0 | 1.0 | 25 | 0.4 | 2.9 | 7 |
| 1.5 | 3.0 | 3.0 | 25 | 0.3 | 1.5 | 15 |
| 0.5 | 2.0 | 2.0 | 25 | 0.2 | 0.8 | 30 |
| 1.0 | 2.0 | 2.0 | 25 | 0.3 | 1.5 | 14 |
| 2.0 | 2.0 | 2.0 | 25 | 1.2 | 4.0 | 7 |
| 1.5 | 1.0 | 1.0 | 400 | 1.5 | 3.3 | 11 |
| 1.5 | 2.0 | 2.0 | 400 | 2.3 | 4.8 | 8 | where the frequency of the RF power used was 450 KHz.

Figure 5A:
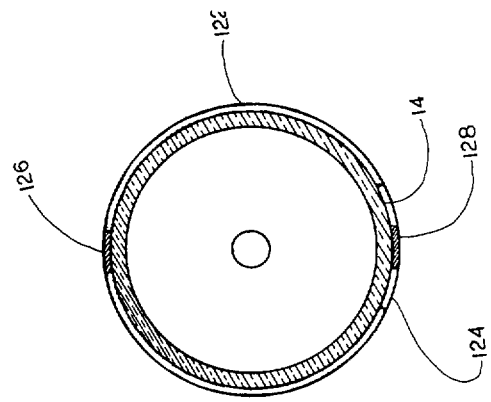
FIG. 5A is a cross-sectional view taken along lines A—A of FIG. 5.
Figure 5:
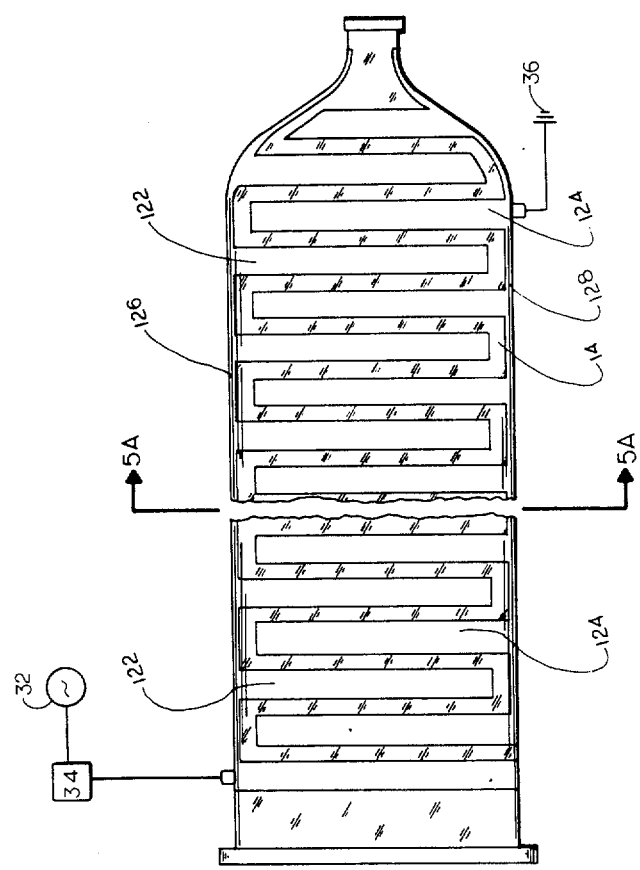
FIG. 5 is a side elevational view of a further embodiment of the present invention.

FIGS. 5 and 5A depict an electrode structure 120 which is similar to that depicted in FIGS. 4 and 4A. In this embodiment, the longitudinal electrodes fingers 84 and 86 of FIGS. 4 and 4A are replaced by partial circumferential band electrode fingers 122 and 124, respectively. Each set of partial circumferential band electrode fingers 122 and 124 is connected to a one of two longitudinal connecting electrodes 126 and 128, respectively, located on opposing sides of the tube 14. As will be obvious to one ordinarily skilled in the art, the electrode configuration of FIGS. 5 and 5A will function in much the same manner as the electrode structure depicted in FIGS. 4 and 4A.

Figure 6:
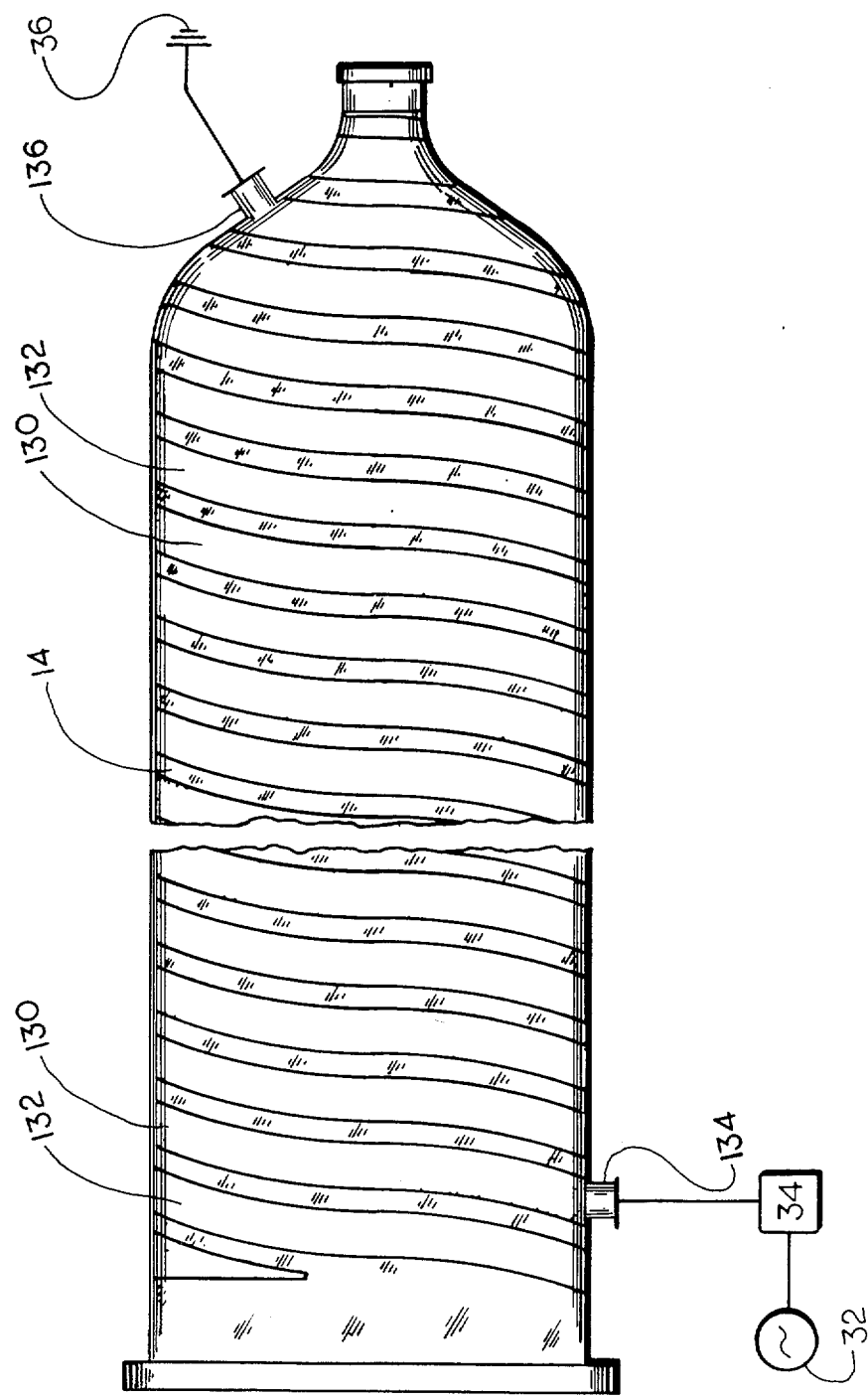
FIG. 6 is a side elevational view of yet another embodiment of the present invention.

FIG. 6 depicts an electrode structure composed of a single, narrow RF powered electrode 130 and a single, narrow ground electrode 132 simultaneously wound about the tube 14 in a helix such that the spacing between each electrode 130 and 132 is everywhere equal. Electrical connections 134 and 136 to RF power and ground potential, respectively, may be made at opposite ends of the structure to offset resistive losses that may occur along the length of the electrodes 130 and 132. As will be obvious to one ordinarily skilled in the art, the electrode structure of FIG. 6 will function in much the same manner as the electrode structure depicted in FIGS. 4 and 4A.

Different types of electrode structure and/or different electrode width and spacing may be utilized in combination in the application of the instant invention to a single process chamber in order to more tailor the plasma intensity to the chamber and/or chamber deposits. For example, under certain processing conditions, wall deposition in an LPCVD tube can occur primarily within a central region of the tube. In this case, the utilization of an electrode structure that is identical over the whole length of the tube could lead to undue etching of the tube outside the central deposition region. It would thus be more beneficial to utilize two different electrode widths and spacings, where the minimal spacing and electrode width twice that of the spacing is used about the central deposition zone and narrower electrode widths with wider spacing outside the central deposition zone. This configuration would yield a greater plasma intensity within the central deposition zone than outside it, and minimize chamber wall erosion. A further example would be where the dielectric chamber wall is not uniform in thickness. As the thickness of the chamber wall effects the degree of electric power transmission to the plasma, the use of a single, uniform electrode structure on a chamber whose wall thickness is not everywhere uniform would lead to a nonuniform discharge. In those cases, it is preferable to utilize two or more different types of electrode structures. Where the chamber wall is thick, the combination of minimum electrode spacing with electrode widths of one or more times the spacing should be utilized, while in the regions where the chamber wall is thin, wider spacings with electrode widths less than one times the spacing should be used. In this way the effect of the chamber wall thickness can be compensated for and a relatively uniform plasma over the whole of the chamber wall obtained.

Figure 7:
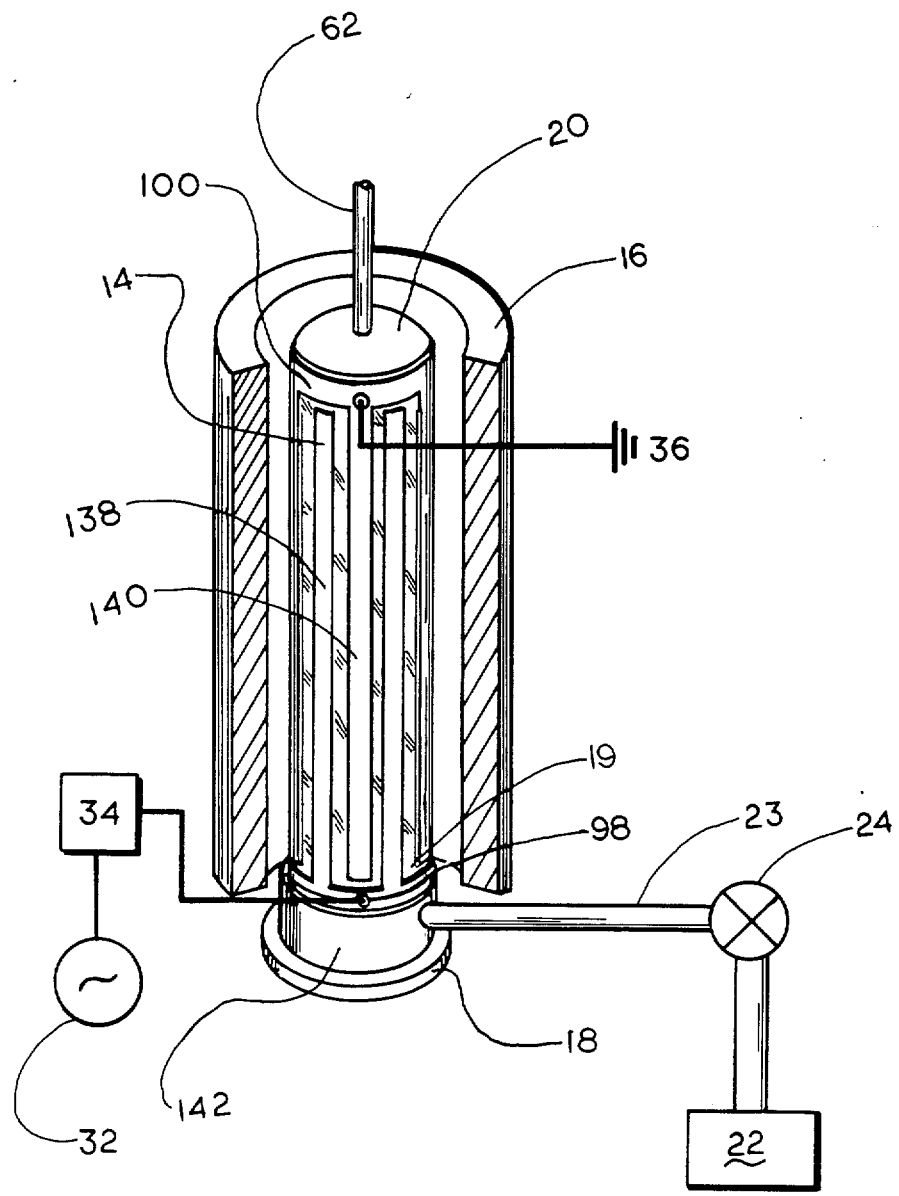
FIG. 7 is a perspective view of an embodiment of the present invention as applied to a vertical LPCVD system.

In the examples depicted heretofore, the general geometry of a horizontal LPCVD chamber has been employed. Other types of processing systems to which the instant invention is applicable, such as vertical LPCVD, plasma-enhanced CVD and diffusion systems typically utilize tubular quartz of essentially similar geometry. FIG. 7 depicts the instant invention as applied to a vertical LPCVD system wherein the electrodes 138 and 140 are deposited onto the exterior of the tubular quartz chamber 14 which is situated vertically within a furnace 16. One end 19 of the quartz chamber 14 is connected to a cylindrical vacuum manifold 142 and sealed with a baseplate 18, while the other end 20 is closed. The vacuum manifold 142 is connected to a vacuum pump 22 via a vacuum exhaust line 23 configured with a vacuum valve 24. Processing and cleaning gas are introduced through a gas distribution tube 62 formed through the closed end 20 of the quartz tube 14. The electrodes 138 and 140 are alternately connected to a source of RF power 32 through a matching network 34 and to ground potential 36, respectively, by means of electrode rings 98 and 100, respectively. As should be obvious to one skilled in the art, the devices described heretofore will function in a substantially similar manner for these chambers as for horizontal LPCVD chambers.

Other types of processing systems to which the instant invention is applicable include cold-wall processing systems such as epitaxial and reduced pressure epitaxial reactors. In these and other such applications of the instant invention, the external deposited electrodes may have an effect on the operation of the processing system and may play an active role in the operation. Such is the case for the combined RF inductively heated/radiantly heated epitaxy system as described in U.S. Pat. No. 4,579,080 issued on Apr. 1, 1986 to Martin et al., and depicted in FIG. 8. In this system, substrates 150 are placed on a susceptor 152 composed of graphite, situated in a cylindrical quartz bell jar 154. The susceptor assembly 152 is fixtured on a quartz stand 155 which, in turn, is fixtured on a base plate 156. The base plate 156 matingly engages the cylindrical vacuum manifold 157 so as to form a vacuum tight seal. The vacuum manifold 157, in turn, matingly engages the bell jar 154 so as to form a vacuum tight seal. The bell jar 154 is evacuated by a vacuum pump 158 via a vacuum exhaust line 159 configured with a vacuum valve 160. Process gases are introduced through a gas tube 162 which is form through the top of the bell jar 154. Gas flow is controlled by valves 164 and flow controllers 166. The susceptor 152 is heated by passing electric current at 10 KHz through induction coils 168 fixtured about the bell jar 154 which induces a circulating current in the susceptor 152. The hot susceptor 152 in turn heats the substrates 150, causing both the hot susceptor 152 and substrates 150 to outwardly radiate heat energy. The radiation passes through the quartz wall of the bell jar 154 and is reflected back towards the susceptor 152 and substrates 150 by a reflective coating 170 deposited on the exterior of the bell jar 154. The reflective coating 170 is typically composed of gold. The bell jar 154 is kept cool by flowing cold water 172 through the annular space 173 formed by the bell jar 154 and a water containment jacket 174. In the course of depositing films on the substrates 150, some material 176 is deposited on the interior wall of the bell jar 154. As this deposit 176 will, after successive deposition cycles, begin to flake off and create particles within the bell jar 154 that can lodge on the substrates 150, it must be periodically removed. Additionally, the deposit 176 will absorb some of the radiation, interfering with the operation of the system.

Figure 9:
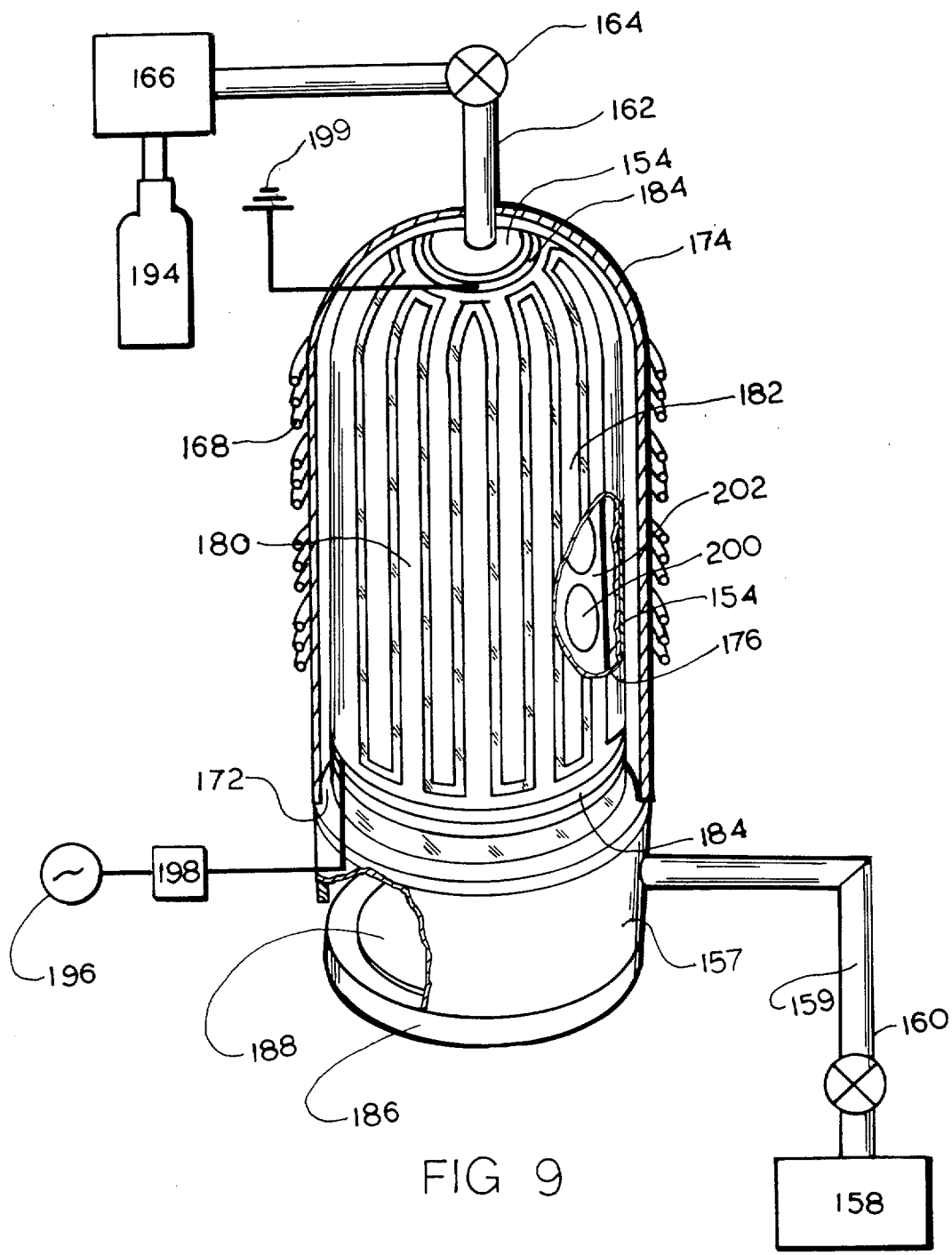
FIG. 9 is a perspective view of an embodiment of the present invention as applied to the epitaxial reactor of FIG. 8.

As there already exists a coating 170 on the exterior of the bell jar 154 which is also conductive, the application of deposited electrodes on top of the coating 170 will not work. Furthermore, the use of deposited electrodes with a electrode width to spacing ratio of two as suggested above in place of the reflective coating 170 would have a deleterious effect on the operation of the system by allowing over 30% of the radiation currently reflected back to the substrates 150 to escape through the spaces between the electrodes. However, by using the instant invention with an electrode width to spacing ratio of ten or more, as depicted in FIG. 9, and a reflective material such as gold for the electrodes, the radiation loss as compared to the continuous coating would be less than 10% and would not have a significantly adverse effect on the system's operation. In FIG. 9, an interleaved structure of RF powered electrodes 180 and grounded electrodes 182 are deposited on the exterior of the bell jar 154. The structure depicted is substantially similar to that depicted in FIGS. 4 and 4A, although the structures of FIGS. 2, 5, 5A and 6 could also be used, provided in each case that the area covered by the electrodes be greater than approximately 90% of the exterior surface area of the bell jar 154 subjected to the radiation. An RF power supply 196 with matching network 198 and ground potential 199 are connected to the electrodes 180 and 182, respectfully, by the connection bands 184, similar to that depicted in FIG. 4.

To utilize the instant device as generally depicted in FIG. 9 for chamber cleaning, the susceptor 152 and baseplate 156 are removed from the bell jar 154 and a second baseplate 186 is affixed to the bottom of the vacuum manifold 157, making a vacuum tight seal. The bell jar 154 is patterned with RF electrodes 180 and ground electrodes 182, which are connected to RF power and ground potential, respectively, via connecting rings 184. The baseplate 186 is formed with a dielectric coating 188 such as quartz or Al2O3. The water 172 is drained from the system and the bell jar 154 is evacuated via the vacuum pump 158 by opening valve 160. Cleaning gas is introduced into the bell jar 154 through the gas inlet tube 162. The cleaning gas is supplied from a gas cylinder 194 and its flow is controlled by a valve 164 and flow control device 166. The gas may be such known gases as CF4, CF4+O2, C2F6, SF6 or NF3, or mixtures of theses gases with inert gases such as Ar, He or N2. RF power of 100 to 5000 watts at 50 KHz to 100 MHz is applied from the RF power source 196 through the matching network 198, creating a plasma within the bell jar 154. Etchant species created by the decomposition of the cleaning gas in the plasma react with wall deposits 176 to form volatile products which are pumped out of the bell jar 154 by the vacuum pump 158.

Figure 8:
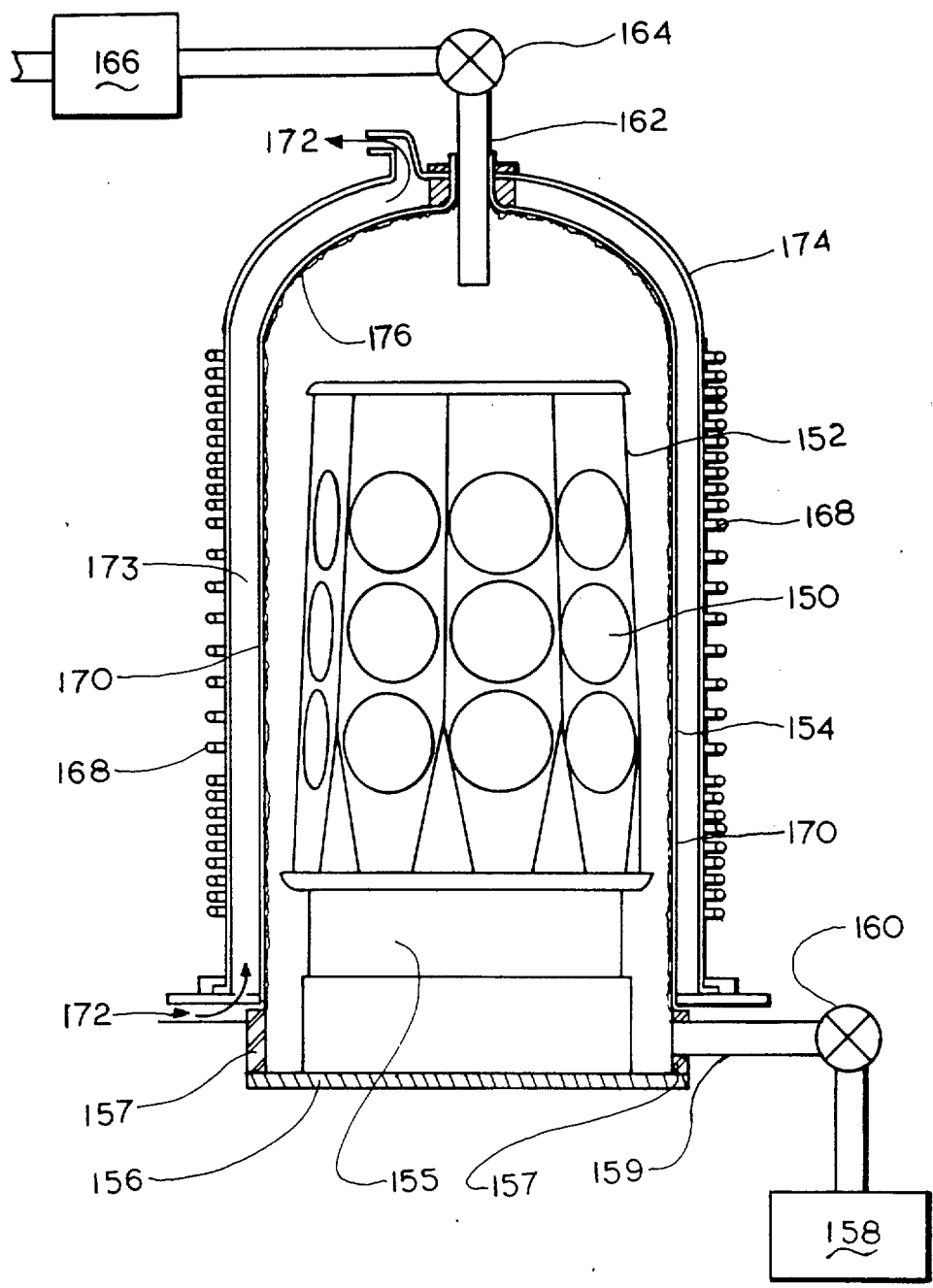
FIG. 8 is a side elevational view with cutaway portions of a prior art epitaxial reactor.

To utilize the instant device as generally depicted in FIG. 9 for cleaning substrates prior to processing, the substrates 150 are placed on the susceptor 152 which is then loaded into the bell jar 154 with the baseplate 156 making a vacuum tight seal with the vacuum manifold 157 as depicted in FIG. 8. The bell jar 154 is patterned with RF electrodes 180 and ground electrodes 182, which are connected to RF power and ground potential, respectively, via connecting rings 184. The water 172 is drained from the system and the bell jar 154 is evacuated via the vacuum pump 158 by opening valve 160. Cleaning gas is introduced into the bell jar 154 through the gas inlet tube 162. The cleaning gas is supplied from a gas cylinder 194 and its flow is controlled by a valve 164 and a flow control device 166. The gas may be such known gases as NF3+Ar or H2. RF power of 100 to 5000 watts at 50 KHz to 100 MHz is applied from the RF power source 196 through the matching network 198, creating a plasma between the bell jar 154 and the susceptor 152. Etchant species created by the decomposition of the cleaning gas in the plasma react with contaminants on the surfaces of the substrates 150 to form volatile products which are pumped out of the bell jar 154 by the vacuum pump 158.

The requirement of draining the water 172 from the system in the processes above may be eliminated if the water 172 in the system is replaced by an alternate cooling fluid that has a high dielectric strength such as mineral oil or some fluorocarbon fluids.

Figure 10:
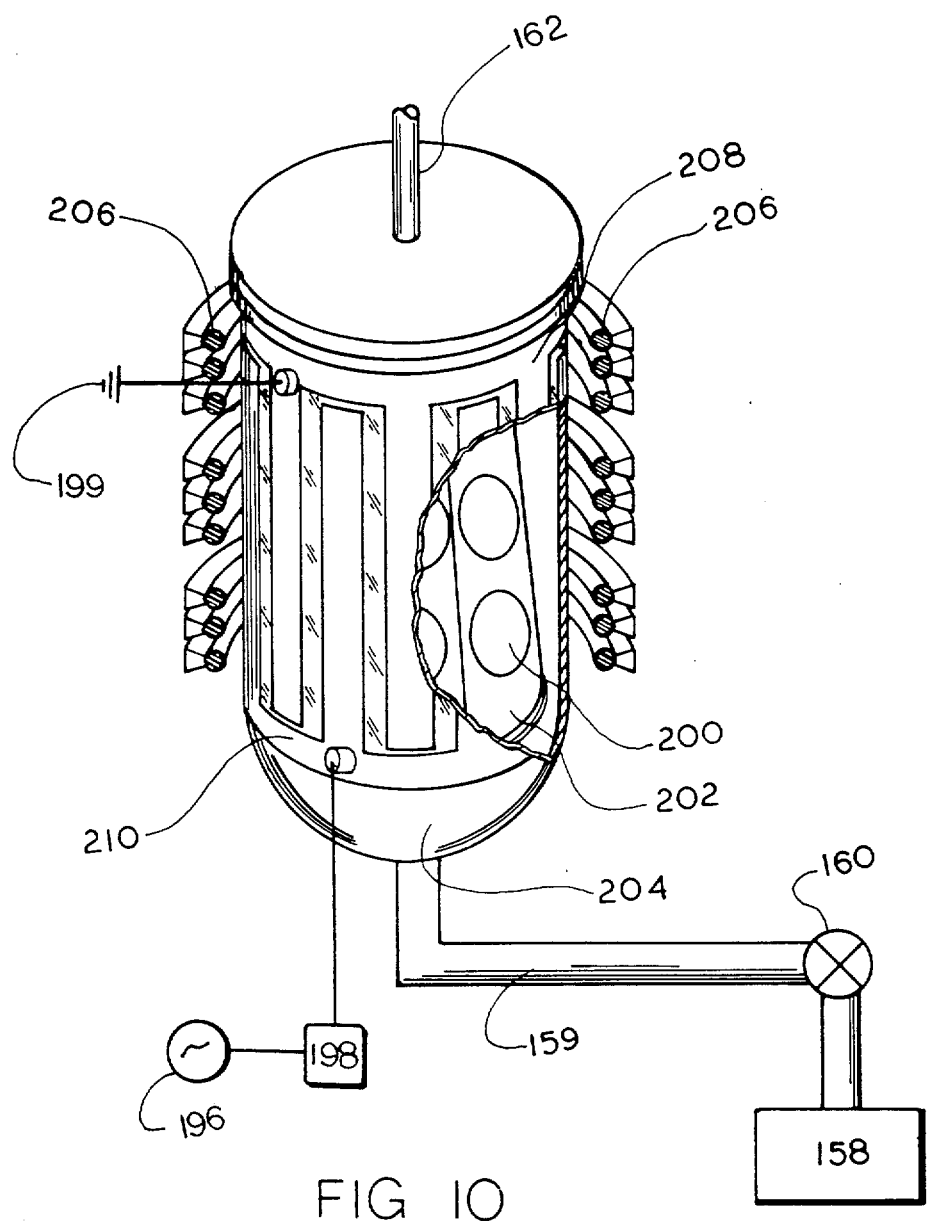
FIG. 10 is a perspective view of an embodiment of the present invention as applied to a radiantly heated epitaxial reactor.

Another application where the presence of electrodes on the exterior of the process chamber may effect the operation of the processing equipment is depicted in FIG. 10. FIG. 10 depicts a radiantly heated epitaxial reactor wherein substrates 200 are placed upon a susceptor 202 located within a quartz bell jar 204. The susceptor 202 and substrates 200 are heated by radiation from lamps 206 situated about the quartz bell jar 204. Operation of this system 85 is similar to the system depicted in FIGS. 8 and 9, except that the system of FIG. 10 uses radiant lamp heating instead of RF induction heating and forced air cooling of the bell jar 204 instead of water cooling. The electrodes 208 and 210, if made from a material such as gold, would block the radiation from the lamps 206 from being transmitted to the susceptor 202 and substrates 200. Thus in this application of the instant invention, opaque electrodes would have a deleterious effect on the operation of the system. However, by fabricating the electrodes 208 and 210 from a suitable conductive material that also is substantially transparent to the radiation emitted by the lamps 206 such as indium tin oxide, the electrodes would have no deleterious effect on the system and, as should be obvious to one skilled in the art, the device would function in a substantially similar manner to that depicted in FIG. 9.

The materials used for construction of the thin deposited electrodes described hereinabove and their structure is of importance to the success of the device. The initial requirements are that the thin films must be adherent to the dielectric chamber wall and that they are suitably electrically conductive so as to not cause undue resistive power loss along their length. Suitable materials for deposition on quartz or alumina chambers include gold, chromium, nickel, copper, silicon, indium tin oxide and various silicides. All have relatively good adherence to quartz and alumina and have good conductivity with the exception of silicon, whose conductivity is poor at room temperature, but whose conductivity becomes acceptable at elevated temperatures. The thickness and width of the deposited electrodes is also of import, as their ability to conduct electricity along their length with minimal resistive power losses is a function of their cross-sectional area. Thus, wider and thicker electrodes are more suitable from an electrical standpoint. However, as there exists a difference in the thermal coefficient of expansion between the electrode material and the chamber material, thinner and narrower electrodes are more suitable where they will be subjected to elevated temperatures, as the relative amount of expansion at elevated temperatures would be less and they can more easily yield to relieve the stress caused by the differences in expansion. Typically, film thicknesses on the order of 1 to 50 microns are best, with the preferred thickness being principally dependent upon the conductivity and thermal coefficient of expansion of the electrode material.

Where the electrodes and chamber are subjected to elevated temperatures as is the case in LPCVD systems, additional factors must be considered in the selection of the proper electrode material and structure, such as diffusion of the electrode material through the chamber wall and subsequent interaction with the process and reaction of the electrode material with the external ambient, most typically air.

Figure 11:
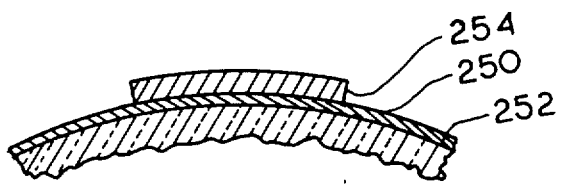
FIG. 11 depicts an end cross sectional view of an electrode structure of the present invention.
Figure 12:
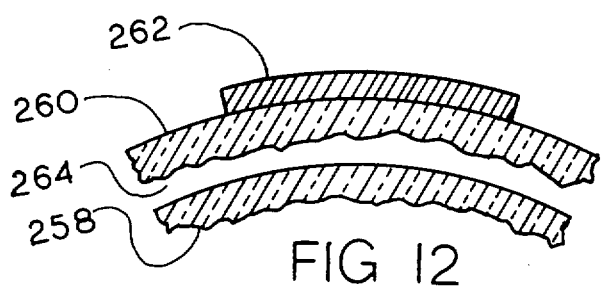
FIG. 12 depicts an end cross sectional view of a dual-walled reactor together with an electrode of the present invention.

Diffusion of the electrode material through the chamber wall is a concern for almost all electrode materials above 1000 degrees C., but may also be a problem at lower temperatures for certain electrode materials such as gold. Silicon is a good choice at these elevated temperatures due to its good conductivity above 400 degrees C., its low diffusivity through quartz and alumina, and its negligible effect on most processes if some does diffuse through the chamber wall. Where silicon is not desirable, other methods which will prevent or significantly reduce the diffusion of the electrode material through the chamber wall such as that depicted in FIG. 11 can be employed. In FIG. 11, a deposited dielectric film 250 such as Si3N4 that has high resistance to diffusion of the electrode material is shown deposited on the exterior of the chamber wall 252 prior to deposition of the electrodes 254. Alternately, as depicted in FIG. 12, a dielectric chamber formed from two walls 258 and 260 can be employed, where the electrodes 262 are deposited on the exterior of the outer chamber wall 260 and a gas such as N2 or HCl is flowed through the annular space 264 between the inner chamber wall 258 and the outer chamber wall 260 where a suitable inlet to introduce the gas and outlet to exhaust the gas from the annular space is utilized.

Figure 13:
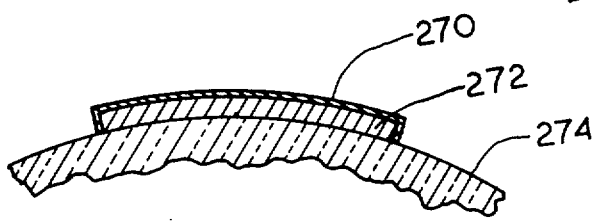
FIG. 13 depicts an end cross sectional view of another electrode structure of the present invention.

Reaction of the electrode material with the ambient to which it is subjected is of concern, especially at elevated temperatures in air or where deionized water used as a cooling fluid is in contact with the electrode material. A silicon film subjected to air at 800 degrees C. for one year will have approximately the upper 5 microns converted to SiO2. For a thin silicon deposit of 10 microns thickness, this amount of conversion to SiO2 will seriously effect its conductivity. Moreover, a gold film in contact with flowing deionized water will erode at the approximate rate of 250 microns per year or more. For electrode materials where reactivity with the ambient is of concern, they may be passivated as depicted in FIG. 13 where a thin dielectric film 270 composed of a material such as Si3N4, SiO2, carbon-based polymers or silicon-based polymers that is substantially unreactive with the ambient is shown deposited over the electrodes 272 after deposition of the electrodes 272 on the chamber wall 274. The dielectric film 270 completely covers the electrodes 272 and may also be deposited directly on the chamber wall 274 in the spaces between the electrodes 272. Openings in the passivating film 270 may be etched to allow electrical connection to the electrodes 272.

Figure 14:
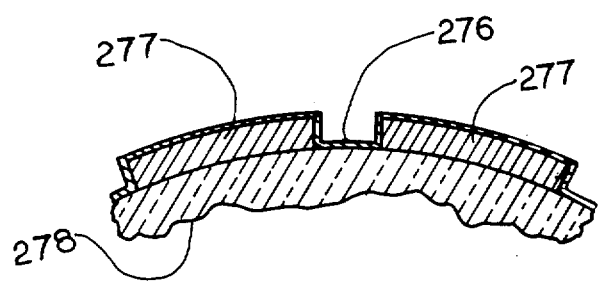
FIG. 14 depicts an end cross sectional view of a further electrode structure of the present invention.

Deposited layers of dielectric films may also be employed in conjunction with the deposited electrodes to prevent electrical breakdown between the electrodes or as an active component in the operation of the processing system. Where electrical breakdown between the electrodes in the ambient about the electrodes is of concern, a dielectric film may be used as depicted in FIG. 14. In FIG. 14, a dielectric film 276 composed of a material of high dielectric strength such as SiO2, Al2O3 or Si3N4 is shown deposited on top of and between the electrodes 277 after deposition of the electrodes 277 on the chamber wall 278. In this way, the potential for electrical breakdown between the electrodes can be lessened and narrower electrode spacing utilized. For example, in the example described hereinabove, the minimum spacing between the electrodes exposed to an air ambient under plasma conditions that developed a 3 KV peak to peak RF voltage was 1 cm. By completely covering the electrodes with a deposit of SiO2 of approximately 0.5 mm thickness, the minimum spacing can be reduced to 0.5 cm. This is because minimum electrical breakdown voltage of the SiO2 film is added to the minimum breakdown voltage in air. Thus, the minimum electrode spacing is determined by the maximum RF peak to peak voltage less the breakdown voltage for each dielectric film the electric field must penetrate divided by the electrical breakdown voltage in air.

Dielectric films may also be used in conjunction with the deposited electrodes to modify or effect the operation of the processing system. In the example depicted in FIG. 9, unwanted loss of radiation occurs through the spaces between the electrodes. This radiation loss can be minimized by the use of a dielectric film as depicted in FIG. 14. In FIG. 14, a dielectric film 276 is shown deposited between the electrodes 277 after deposition of the electrodes 277 on the chamber wall 278. The dielectric film 276 is composed of a material that has a high index of refraction compared to that of the material used to form the chamber wall 278 and that is substantially transparent to the radiation. The interface between the chamber wall 278 and dielectric film 276 will reflect some portion of the radiation arriving at it according to the equation:

$$R = (N1 - N2)/(N1 + N2) \quad (16)$$

where R is the fraction of radiation reflected, N1 is the index of refraction of the chamber wall material and N2 is the index of refraction of the dielectric film material. Thus if the dielectric film 276 is composed of a material such as TiO2 or ZnS whose index of refraction is approximately 2.2 and the chamber wall 278 is composed of SiO2 whose index of refraction is approximately 1.4, the amount of radiation reflected at the interface will be approximately 22%. Higher percentages of reflection can be obtained by multiple coatings of materials with dissimilar indexes of refraction such as TiO2, ZnS, SiO2 or Si3N4. The dielectric film 276 may be deposited only between the electrodes 277 or, as depicted in FIG. 14, be deposited both between and on top of the electrodes 277. In the latter case, the dielectric film may also be used to modify the heat transfer coefficient of the chamber wall 278 and thus effect the operation of the processing system.

Figure 15:
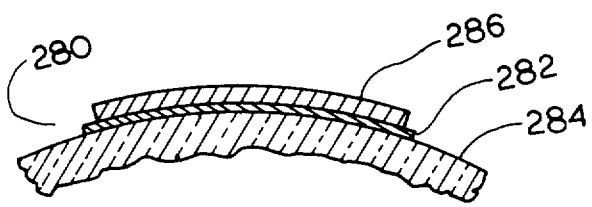
FIG. 15 depicts an end cross sectional view of yet another electrode structure of the present invention.
Figure 16:
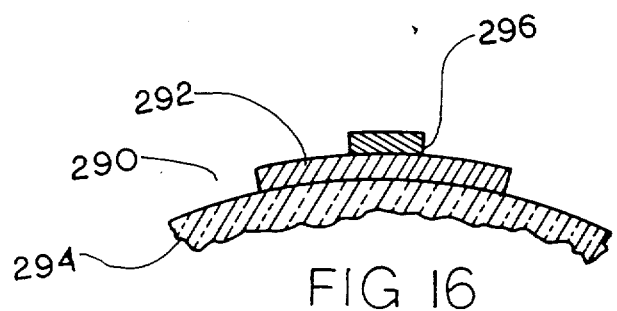
FIG. 16 depicts an end cross sectional view of yet a further electrode structure of the present invention.

Electrodes composed of two or more layers of two or more conductive materials may also be used, as depicted in FIGS. 15 and 16. In FIG. 15, the electrode 280 consists of a thin layer 282 of a material that has excellent adhesion properties to the chamber wall 284 such as chromium and a thicker layer 286 of a material that is easier and/or less costly to deposit such as nickel. In FIG. 16, the electrode 290 consists of a first layer 292 of a material that possesses good adhesion to the chamber wall 294 and low diffusivity through the chamber wall 294, but relatively poor electrical conductivity such as silicon and a second layer 296 of a material that possesses high electrical conductivity such as chromium. As depicted in FIG. 16, the second layer 296 may be formed with a width that is much narrower than the first layer 292.

Figure 17:
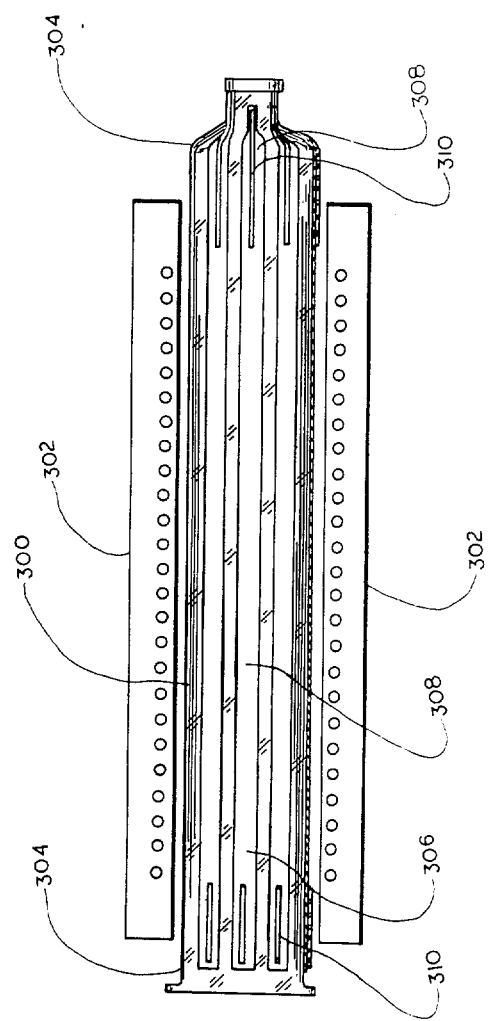
FIG. 17 depicts a side elevational view of an electrode structure of the present invention.

Two or more types of electrode material structures may also be employed with a single device in order to improve its performance as depicted in FIG. 17. In FIG. 17, a quartz tube 300 is situated in a furnace 302, with both ends 304 of the tube 300 protruding outside the furnace 302. Within the furnace 302 the tube 300 is hot, while outside the furnace 302, the tube ends 304 are cold. The electrodes 306 deposited on the tube consist of a single layer of silicon 308 deposited on that area of the tube 300 located within the furnace and dual layers of silicon 308 and chromium 310 on the tube ends 304. The chromium layer 310 is used outside the furnace 302 because the electrical conductivity of the silicon layer 308 is relatively poor outside of the furnace 302 where the temperature is typically less than 200 degrees C. The chromium layer 310 is not used within the furnace 302 where, due to the high temperature, the conductivity of the silicon layer 308 is good and the chromium 310 could potentially diffuse through the tube 300 and effect the process carried out within.

Various combinations of single layer conductive films such as silicon, chromium, nickel, gold, copper or indium tin oxide or multiple layered conductive films such as chroumium/nickel, silicon/chromium or silicon/silicide with or without various dielectric films such as SiO2, Al2O3, Si3N4 or carbon- or silicon-based polymers may be utilized in order to best meet the specific requirements of the processing system.

The deposition of the conductive or dielectric films onto the exterior surface of the chamber wall or each other can be accomplished by any number of conventional methods including: vacuum evaporation, RF sputtering, chemical vapor deposition, electroplating, electroless plating or spin-on.

Patterning of the conductive or dielectric films into the desired structures or patterns can be accomplished by any number of conventional methods including: masking prior to deposition, masking prior to deposition and subsequent lift-off, or masking after deposition with subsequent chemical etching, where masking includes photomasking.

While the invention has been particularly shown and described with reference to certain preferred embodiments, it will be understood by those skilled in the art that various alterations and modifications in form and detail may be made therein. Accordingly, it is intended that the following claims cover all such alterations as fall within the true spirit and scope of the invention.

What is claimed is:

1. An apparatus for the in-situ cleaning of the interior surface of the wall therein and/or the tooling or substrates to be disposed therein comprising:

a processing chamber including a chamber wall that is composed substantially of dielectric material;

at least one powered electrode formed from a thin film of conductive material deposited directly on the exterior surface of said chamber wall;

at least one grounded electrode formed from a thin film of conductive material deposited directly on the exterior surface of said chamber wall;

a means for introducing gas into said chamber;

a means for supplying a gas to said gas introducing means;

a means for establishing and maintaining a reduced pressure environment within said chamber;

a means for supplying radio frequency electric power;

said powered electrode, said grounded electrode and said RF power supply means forming an electrical network;

said electrical network formed to create a radio frequency electrical field between said powered electrode and said grounded electrode, whereby a plasma is created in the interior of said chamber by the interaction of said gas and said RF electrical field under sub-atmospheric pressure conditions, said plasma acting to clean unwanted deposits and/or contaminants from the inner surface of the wall of said chamber and/or the tooling or substrates to be disposed within said chamber.

2. The apparatus as described in claim 1 wherein said electrodes are configured so as to create a plasma that substantially covers the whole of the interior surface of the wall of said chamber.

3. The apparatus as described in claim 1 wherein said electrodes are configured so as to cover substantial portions of the exterior surface of said chamber.

4. The apparatus as described in claim 1 wherein said chamber wall is cylindrically shaped and said electrodes are shaped as narrow strips and said electrodes are oriented longitunally along said chamber wall.

5. The apparatus as described in claim 1 wherein said chamber wall is cylindrically shaped and said electrodes are shaped as narrow strips and said electrodes are oriented circumferentially about said chamber wall.

6. The apparatus as described in claim 1 wherein said chamber wall is cylindrically shaped and said electrodes are shaped as narrow strips and said electrodes are oriented in a dual helical pattern about said chamber wall.

7. The apparatus as described in claims 4, 5, or 6 wherein the width of said electrodes is twice the width of the space separating said electrodes.

8. The apparatus as described in claims 4, 5 or 6 wherein the width of the space separating said electrodes is the minimum width that can be employed without causing electrical breakdown or arcing between said electrodes.

9. The apparatus as described in claim 1 wherein each of said electrodes is shaped to include two or more electrode fingers and said electrode fingers of each powered electrode are interleaved between the fingers of each grounded electrode.

10. The apparatus as described in claim 9 wherein the width of said interleaved electrodes fingers is twice the width of the space separating said interleaved electrode fingers.

11. The apparatus as described in claim 9 wherein the width of the space separating said interleaved electrode fingers is the minimum width that can be employed without causing electrical breakdown or arcing between said interleaved electrode fingers.

12. The apparatus as described in claim 1 wherein said thin films of conductive material forming said electrodes are composed of a material selected from the group consisting of silicon, gold, chromium, nickel, copper, various silicides, or indium tin oxide.

13. The apparatus as described in claim 1 wherein said thin films of conductive material forming said electrodes are composed of multiple layers of electrically conductive films selected from the group consisting of chromium/nickel, silicon/chromium, chromium/gold or silicide/silicon.

14. The apparatus of claim 1 further comprising a means for preventing the diffusion of the material of said electrode films through said chamber wall into said chamber.

15. The apparatus as described in claim 14 wherein said means for preventing the diffusion of said material through said chamber wall is a dielectric film deposited on the exterior of said chamber wall prior to the deposition of said electrode films.

16. The apparatus as described in claim 15 where said dielectric film is composed of silicon nitride ($Si_3N_4$).

17. The apparatus as described in claim 1 further comprising a means for preventing the reaction of the material of said electrode films with the ambient.

18. The apparatus as described in claim 17 wherein said means for preventing the reaction of the said material with the ambient is a dielectric film deposited over said electrode films such that said electrode films are completely covered by said dielectric film.

19. The apparatus as described in claim 18 wherein said dielectric film is a material selected from the group consisting of $Si_3N_4$, $SiO_2$, a carbon-based polymer or a silicon-based polymer.

20. The apparatus as described in claim 1 further comprising a means for preventing the electrical breakdown between said electrode films.

21. The apparatus as described in claim 17 wherein said means for preventing the electrical breakdown between said electrode films is a dielectric film deposited over said electrode films such that said electrode films and the gap between said electrode films are completely covered by said dielectric film.

22. The apparatus as described in claim 21 wherein said dielectric film is a material selected from the group consisting of $SiO_2$, $Al_2O_3$, $Si_3N_4$.

23. The apparatus as described in claim 1 further comprising a means for reflecting radiation emanating from said chamber back into said chamber.

24. The apparatus as described in claim 23 wherein said means for reflection of said radiation is said electrode films being deposited on said chamber wall so as to reflect radiation emanating from said chamber back into said chamber.

25. The apparatus as described in claim 23 wherein said means for reflection of said radiation is said electrode films deposited on said chamber wall and one or more dielectric films deposited on said chamber wall between said electrode films.

26. The apparatus as described in claim 25 wherein said dielectric films are one or more materials selected from the group consisting of $TiO_2$, $ZnS$, $SiO_2$ or $Si_3N_4$.

27. The apparatus as described in claims 24 or 25 wherein said electrode films are composed of gold or a substantial percentage gold alloy.

28. The apparatus as described in claim 1 wherein said means for introducing gas into said chamber includes one or more tubes, each with one or more orifices, configured so as to ensure the uniform distribution of the gas throughout said chamber.

29. The apparatus as described in claim 1 wherein said chamber wall is composed of a material selected from the group consisting of quartz ($SiO_2$), alumina ($Al_2O_3$), mullite ($Al_2O_3$-$SiO_2$) or glass.

30. The apparatus as described in claim 1 wherein the wall of said chamber comprises two concentric walls of dielectric material separated by a space.

31. The apparatus as described in claim 1 wherein said thin film of conductive material forming said electrodes is of a thickness between 1.0 and 5 microns.

32. The apparatus as described in claim 1 wherein said electrodes are so configured so as to create a plasma that covers discrete areas of the interior surface of the wall of said chamber wherein said discrete areas covered by the plasma coincide with the discrete areas of the interior surface of the wall of said chamber where wall deposits form.

33. The apparatus as described in claim 1 further comprising a means for heating said processing chamber wherein all or part of said processing chamber is disposed within an environment of 300 to 1200 degrees Centigrade.

* * * * *